United States Patent [19]
Goto

[11] Patent Number: 5,352,990
[45] Date of Patent: Oct. 4, 1994

[54] POWER MATCHING NETWORK COMPRISING AN INTERMEDIATE TRANSMISSION LINE BETWEEN A TRANSISTOR AMPLIFIER OUTPUT END AND AT LEAST ONE OPEN-END LINE

[75] Inventor: Norio Goto, Tokyo, Japan
[73] Assignee: NEC Corporation, Tokyo, Japan
[21] Appl. No.: 178,877
[22] Filed: Jan. 6, 1994

[30] Foreign Application Priority Data

Jan. 7, 1993 [JP] Japan .................................. 5-000903

[51] Int. Cl.$^5$ ............................................. H03F 3/60
[52] U.S. Cl. ................... 330/286; 330/305; 333/33
[58] Field of Search ............... 330/286, 306, 302, 305; 333/33, 175, 176, 204, 219

[56] References Cited

U.S. PATENT DOCUMENTS 5,270,668 12/1993 Ikeda et al. .......................... 330/286

FOREIGN PATENT DOCUMENTS 146006  7/1986  Japan .................................. 330/286
6444611 2/1989  Japan .
2220503 9/1990  Japan .

OTHER PUBLICATIONS

Snider, David M. "A Theoretical Analysis and Experimental Confirmation of the Optimally Loaded and Overdriven RF Power Amplifier" *IEEE Transactions on Electron Devices*, vol. ED.-14, No. 12, Dec. 1967.

*Primary Examiner*—Paul Gensler

[57] ABSTRACT

In a power matching network which is used between a load and a transistor amplifier producing at its output end an amplified signal comprising a fundamental frequency signal and odd and even harmonic signals and comprises a matching circuit between the load and a line end, an open-end transmission line is connected to the output end and has a predetermined length shorter than a quarter wavelength of the fundamental frequency signal. An intermediate transmission line is connected between the output and the line ends and has a length of a quarter wavelength less the predetermined length. At least one open-end transmission line is connected to the line end and has a length of a quarter wavelength of the odd harmonic signal which is preferably composed of $(2n+1)$—th harmonic signals, where n represents integers starting at 1 and ending at a predetermined integer of at least 2. More preferably, the line end is connected to an additional transmission line which is either a ⅛ wavelength of the fundamental frequency signal long and has an end shorted for high frequency signals or is a 1/16 wavelength of the fundamental frequency signal long.

10 Claims, 3 Drawing Sheets

POWER MATCHING NETWORK COMPRISING AN INTERMEDIATE TRANSMISSION LINE BETWEEN A TRANSISTOR AMPLIFIER OUTPUT END AND AT LEAST ONE OPEN-END LINE

BACKGROUND OF THE INVENTION

This invention relates to a power matching network for use in a high frequency power amplifier circuit in which at least one semiconductor device is used as an active circuit element. In other words, the power matching network is for use in cooperation with an amplifier which comprises the semiconductor device and is herein called a transistor amplifier.

The high frequency power amplifier circuit is typically a microwave power amplifier module comprising a transistor. The transistor amplifier produces at its output end or terminal an amplified signal which comprises a fundamental frequency signal and odd and even harmonic signals.

It is already known that such a microwave power amplifier module is given a high amplifier efficiency when put in Class B operation together with use of a high frequency signal processing circuit, namely, a high frequency trap for adjusting production of the harmonic signals. A theoretically highest amplifier efficiency of 100% is achieved with Class F operation in which a load of the transistor amplifier is matched in connection with the fundamental frequency signal, is shorted or short circuited for all even harmonic signals, and is open ended as regards all odd harmonic signals. This fact is clear from a study of an article contributed by David M. Snider to the IEEE Transactions on Electron Devices, Volume ED-14, No. 12 (December 1967), pages 851 to 857, under the title of "A Theoretical Analysis and Experimental Confirmation of the Optimally Loaded and Overdriven RF Power Amplifier".

In practice, implementation of the Class F operation is troublesome because of possible presence of an infinite number of odd and even harmonic signals. Various power matching networks are consequently in use in the manner which will later be exemplified. For example, power matching networks are disclosed in Japanese Patent Prepublications (A) Nos. 44,611 of 1989 and 220,503 of 1990.

Such a conventional power matching network is appreciably excellently operable. The network is, however, defective in some respects. By way of example, the conventional power matching network is bulky. This is objectionable on using the network in a compact device, such as a portable radio telephone set. Furthermore, the network can not be correctly operable either as an open circuit or as a shorted circuit for some of the harmonic signals.

SUMMARY OF THE INVENTION

It is therefore an object of the present invention to provide a power matching network which is for use in cooperation with a transistor amplifier producing at its output terminal an amplified signal comprising a fundamental frequency signal and odd and even harmonic signals and which is compact.

It is another object of this invention to provide a power matching network which is of the type described and which is excellently correctly and precisely operable as an open ended and a shorted circuit in connection with a plurality of odd and even harmonic signals of considerably high orders.

It is still another object of this invention to provide a power matching network which is of the type described and which is excellently operable in Class F operation.

Other objects of this invention will become clear as the description proceeds.

In accordance with an aspect of this invention, there is provided a power matching network which is for a transistor amplifier producing at its output end an amplified signal comprising a fundamental frequency signal and odd and even harmonic signals and which comprises: (A) an open-end transmission line connected to the output end and having a length of a $\frac{1}{8}$ wavelength of the fundamental frequency signal; (B) an intermediate transmission line connected to the output end and having a line end and a length of the $\frac{1}{8}$ wavelength; (C) at least one open-end transmission line connected to the line end and having a length of a quarter wavelength of the odd harmonic signal; and (D) a matching circuit connected to the line end for the fundamental frequency signal.

In accordance with another aspect of this invention, there is provided a power matching network which is for a transistor amplifier producing at its output end an amplified signal comprising a fundamental frequency signal and odd and even harmonic signals and which comprises: (A) an open-end transmission line connected to the output end and having a predetermined length that is shorter than a quarter wavelength of the fundamental frequency signal and is not equal to a $\frac{1}{8}$ wavelength of the fundamental frequency signal; (B) an intermediate transmission line connected to the output end and having a line end and a length that is equal to the quarter wavelength less the predetermined length; (C) at least one open-end transistor line connected to the line end and having a length of a quarter wavelength of the odd harmonic signal; and (D) a matching circuit connected to the line end for the fundamental frequency signal.

DESCRIPTION OF PREFERRED EMBODIMENTS

Figure 1:
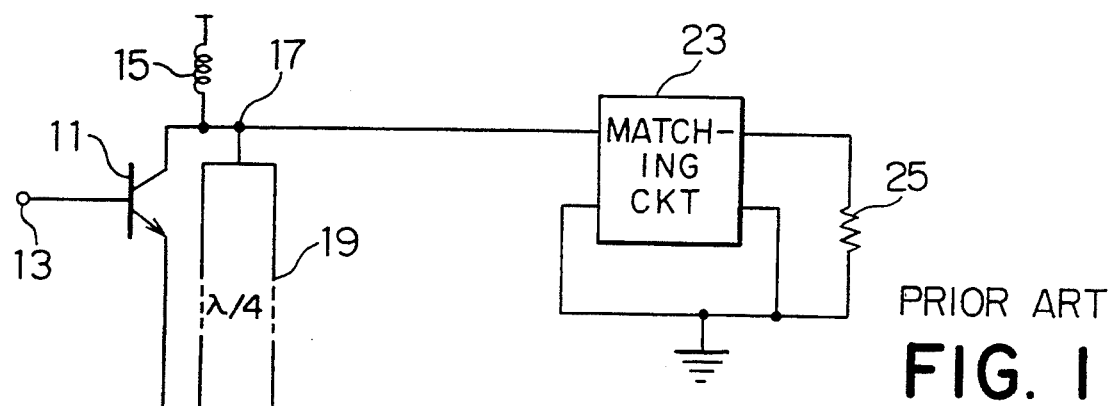
FIG. 1 shows a structure of a conventional power matching network together with a transistor amplifier and a load.
Figure 2:
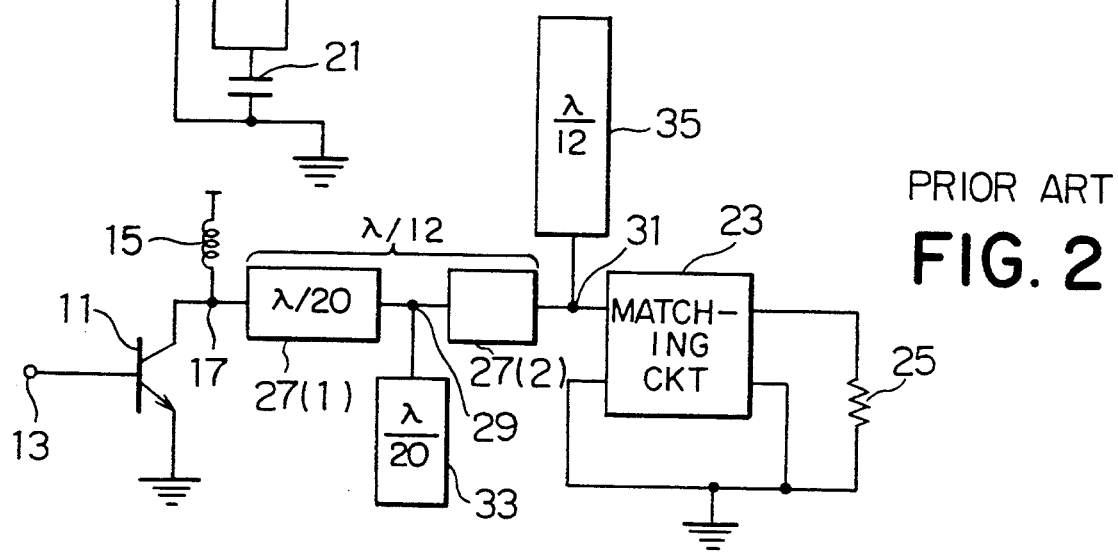
FIG. 2 similarly shows a structure of another conventional power matching network.
Figure 3:
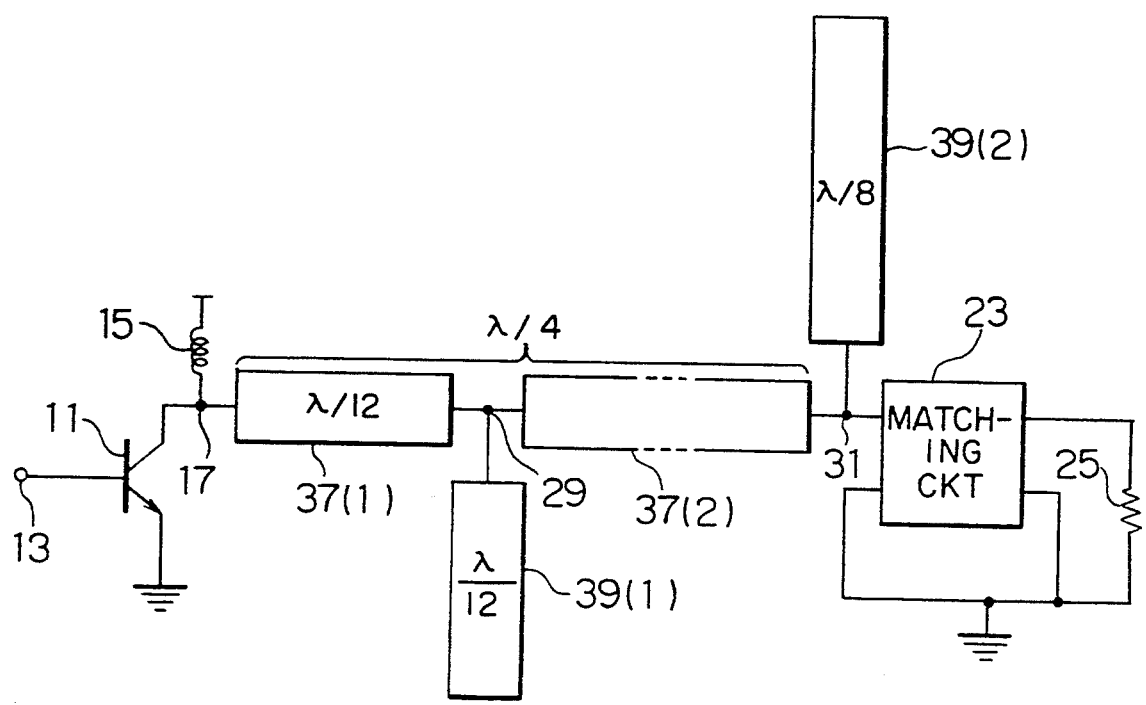
FIG. 3 likewise shows a structure of still another conventional power matching network.

Referring to FIGS. 1 through 3, conventional power matching networks will first be described in order to facilitate an understanding of the present invention. In each of FIGS. 1 through 3, the power matching network is connected to a transistor amplifier which comprises a transistor 11. Throughout the description, it will be presumed merely for simplicity of illustration that the transistor 11 is only one in number and is an n-p-n bipolar transistor.

The transistor 11 has a base, an emitter, and a collector. The emitter is grounded. The base is connected to an amplifier input terminal 13. The collector is connected to a choke coil 15 and thence to a power source depicted by a short horizontal line. The collector is furthermore connected to an amplifier output terminal 17 which is herein referred to alternatively as an output end.

When an input signal is supplied to the input terminal 13, the transistor amplifier produces at the output end 17 an amplified signal which comprises a fundamental frequency signal and odd and even harmonic signals of various orders. Each signal has a wavelength. The wavelength of the fundamental frequency signal will be represented by $\lambda$. The orders will be represented by $(2n+1)$ and $2n$, where n represents a natural number.

In FIG. 1, the power matching network comprises a single transmission line 19 connected to the output end 17 and having a length of a quarter wavelength of the fundamental frequency signal. The transmission line 19 has a free end which is grounded through a capacitor 21 and is therefore shorted or short circuited as regards higher frequency signals. A matching circuit 23 is connected between the output end 17 and a load 25 which is exemplified by a resistor. The matching circuit 23 is for compensating for an influence which is inevitably introduced by the transmission line of lines, such as 19, to match between the transistor amplifier and the load 25 with respect to the fundamental frequency signal.

In operation, the transmission line 19 has a length of n/2 wavelengths for the 2n harmonic, namely, for all even harmonic signals. As a consequence, the output end 17 is short circuited in connection with the even harmonic signals.

The power matching network is very simple in structure. The network is, however, incapable of dealing with odd harmonic signals. Furthermore, the transmission line is lengthy. By way of example, it will be presumed that the transmission line 19 is formed on a substrate of a dielectric constant of 10. In this event, the transmission line 19 is 2 cm long when the fundamental frequency signal has a frequency of 1 GHz.

Depicted in FIGS. 2 and 3, the power matching networks are those revealed in Japanese Patent Prepublication No. 220,503 cited heretobefore. In each of FIGS. 2 and 3, the matching circuit 23 is used on an output stage of the power matching network.

In FIG. 2, a first transmission line 27(1) is connected to the output end 17 and has an intermediate point 29 and a length of a 1/20 wavelength of the fundamental frequency signal. A second transmission line 27(2) is connected to the intermediate point 29 and has a line end 31, to which the matching circuit 23 is connected. The first and the second transmission lines 27 (suffixes omitted) have a sum length of a 1/12 wavelength of the fundamental frequency signal. A first open-ended or open-stub transmission line 33 is connected to the intermediate point 29 and has a length of 1/20 wavelength of the fundamental frequency signal. A second open-end transmission line 35 is connected to the line end 31 and has a length of a 1/12 wavelength of the fundamental frequency signal.

In operation, attention will first be directed to the third harmonic signal. The second open-end transmission line 35 is a quarter wavelength long and is open ended to short the line end 31. The sum length is equal to a quarter wavelength. The output end 17 is open ended. The fifth harmonic signal will next be taken into consideration. The first open-end transmission line 33 is a quarter wavelength long and shorts the intermediate point 29. The first transmission line 27(1) is a quarter wavelength long and leaves the output end 17 open circuit.

In the manner described in the foregoing, the power matching network is operable for the odd harmonic signals. It is possible by combination of the power matching networks of FIGS. 1 and 2 to deal with the odd and the even harmonic signals.

The intermediate point 29 is, however, branched to the first open-end transmission line 33. The output end 17 is therefore not correctly kept open ended for the third harmonic signal. It is possible to cope with the seventh, the ninth, and other harmonic signals by branching at several branching points in the first transmission line 27(1) to open-end transmission lines (not shown) of quarter wavelengths of such harmonic signals. Use of the branching points and of such transmission lines is troublesome.

In FIG. 3, a first transmission line 37(1) is connected between the output end 17 and the intermediate point 29 and has a length of 1/12 wavelength of the fundamental frequency signal. A second transmission line 37(2) is connected between the intermediate point 29 and the line end 31. The first and the second transmission lines 37 have a sum length of a quarter wavelength of the fundamental frequency signal. A first open ended transmission line 39(1) is connected to the intermediate point 29 and has a length of 1/12 wavelength of the fundamental frequency signal. A second open ended transmission line 39(2) is connected to the line end 31 and has a length of a ⅛ wavelength of the fundamental frequency signal.

In operation, attention will first be directed to the second harmonic signal. The second open-end transmission line 39(2) has a length of a quarter wavelength. The line end 31 is shorted. The length is equal to a half wavelength of the second harmonic signal. The output end 17 is shorted. The third harmonic signal will next be taken into account. The first open-end transmission line 39(1) has a length of a quarter wavelength to short the intermediate point 29. The first transmission line 37(1) has a length of a quarter wavelength to leave the output end 17 open.

In this manner, the power matching network is operable for the second and the third harmonic signals. The intermediate point 29 is, however, branched to the first open-end transmission line 39(1). The output end 17 is therefore not precisely shorted for the second harmonic signal. In addition, the power matching network is bulky because the sum length is equal to a quarter wavelength of the fundamental frequency signal.

Figure 4:
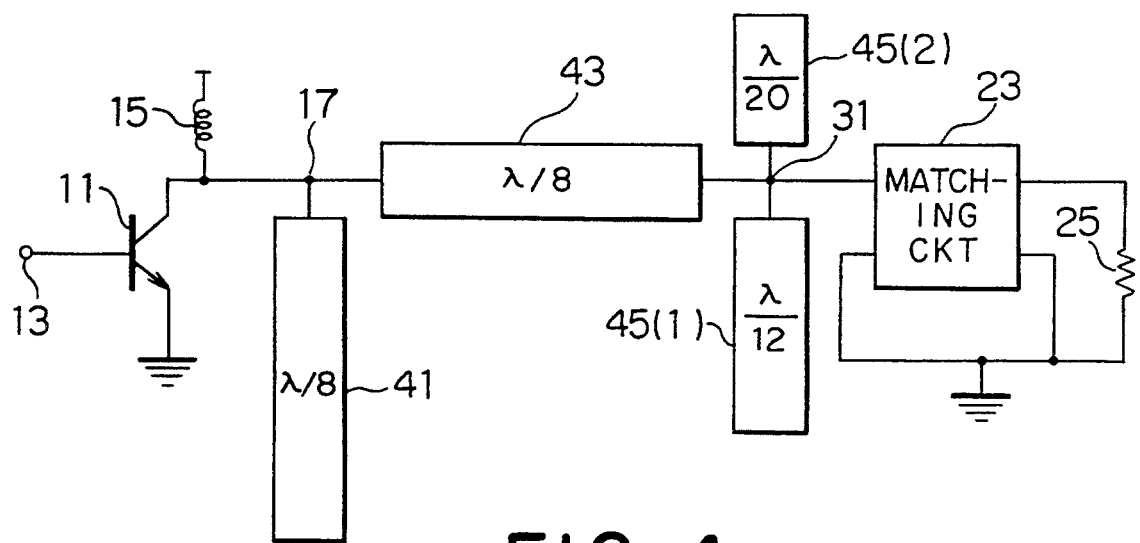
FIG. 4 illustrates a structure of a power matching network according to a first embodiment of the instant invention together with a transistor amplifier and a load.

Referring now to FIG. 4, the description will proceed to a power matching network according to a first embodiment of this invention. The power matching network is for use between a transistor amplifier and a load. Similar parts are designated by like reference numerals.

An open-end or open-stub transmission line 41 is connected to the output end or terminal 17 and has a length of a ⅛ wavelength of the fundamental frequency signal. An intermediate transmission line 43 is connected to the output end 17 and has the line end 31. A first open-end transmission line 45(1) is connected to the line end 31 and has a length of a 1/12 wavelength of the fundamental frequency signal, namely, of a quarter wavelength of the third harmonic signal. Furthermore, a second open-end transmission line 45(2) is connected to the line end 31 and has a length of a 1/20 wavelength of the fundamental frequency signal, namely, of a quarter wavelength of a fifth harmonic signal. In this manner, at least one open-end transmission line 45 (suffixes omitted) is connected to the line end 31 and has a length of a quarter wavelength of a lower-order odd harmonic signal. In contrast to such at least one open-end transmission line 45, the first-mentioned open-end transmission line 41 will now be called a basic transmission line. It is readily understood that the intermediate point 29 (FIG. 2 or 3) is not used.

In operation, attention will be directed to the fact that each of the transmission lines, such as 41, 43, and 45, has a characteristic impedance represented by $Z_0$. The basic transmission line 41 has a length of a $(2n-1)/4$ wavelength of a $(4n-2)$-th harmonic signal, where n represents a natural number as before. The output end 17 is consequently shorted, namely, is given a zero impedance. The basic transmission line 41 has a length of $(2n+1)/8$ wavelength of a $(2n+1)$-th harmonic signal. The basic transmission line 41 therefore serves as impedances of alternatingly plus and minus $jZ_0$ for the $(2n+1)$-th harmonic signals when viewed from the output end 17.

The line end 31 is shorted by the first and the second transmission lines 45 for the third and the fifth harmonic signals. As a consequence, the intermediate transmission line 43 has an end shorted and gives the minus and the plus $jZ_0$ impedances for the third and the fifth odd harmonic signals when viewed from the output end 17. This makes a combination of the transmission lines 41 and 43 operable as a resonator and renders the output end 17 open, namely, gives an infinitely great impedance to the output end 17.

After all, the output end 17 is shorted for a considerable number of even harmonic signals and is open circuit with regard to the third and the fifth harmonic signals. It is possible by connecting the end point 31 to other open-end transmission lines (not shown) of lengths of 1/28 and 1/36 wavelengths and the like of the fundamental frequency signal to make the power matching network operable for $(4n-2)$-th harmonic signals and for the third, the fifth, the seventh, the ninth, and similar odd harmonic signals.

Figure 5:
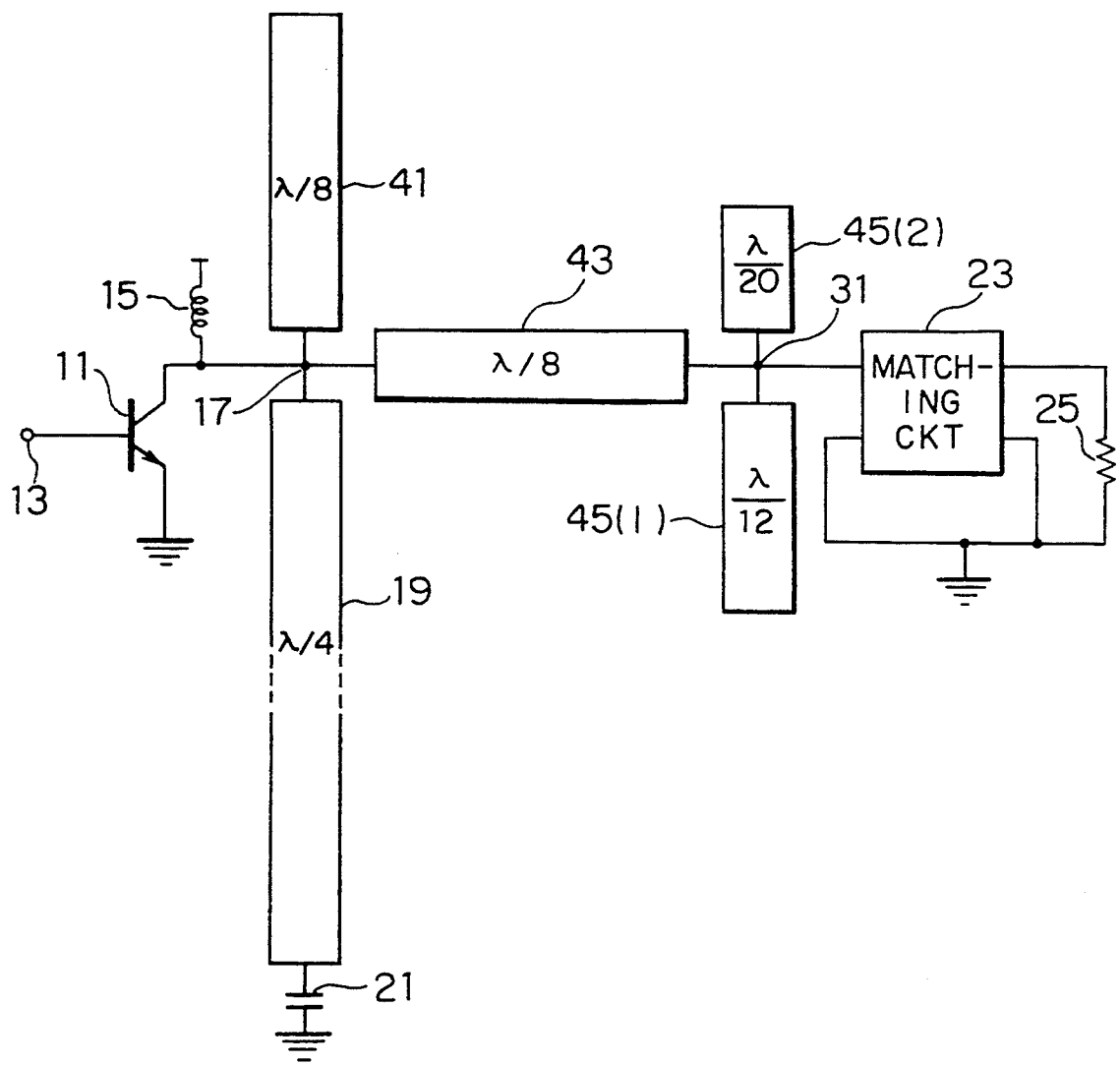
FIG. 5 similarly shows a structure of a modification of the power matching network illustrated in FIG. 4.

Turning to FIG. 5, a modification of the power matching circuit of FIG. 4 additionally comprises a combination of the transmission line 19 and the capacitor 21 which are described in conjunction with FIG. 1. As a result, the power matching network is operable for all even harmonic signals precisely and for the third, the fifth, the seventh, the ninth, and the like odd harmonic signals. In this event, the transmission line 19 may alternatively be referred to as an additional transmission line.

Figure 6:
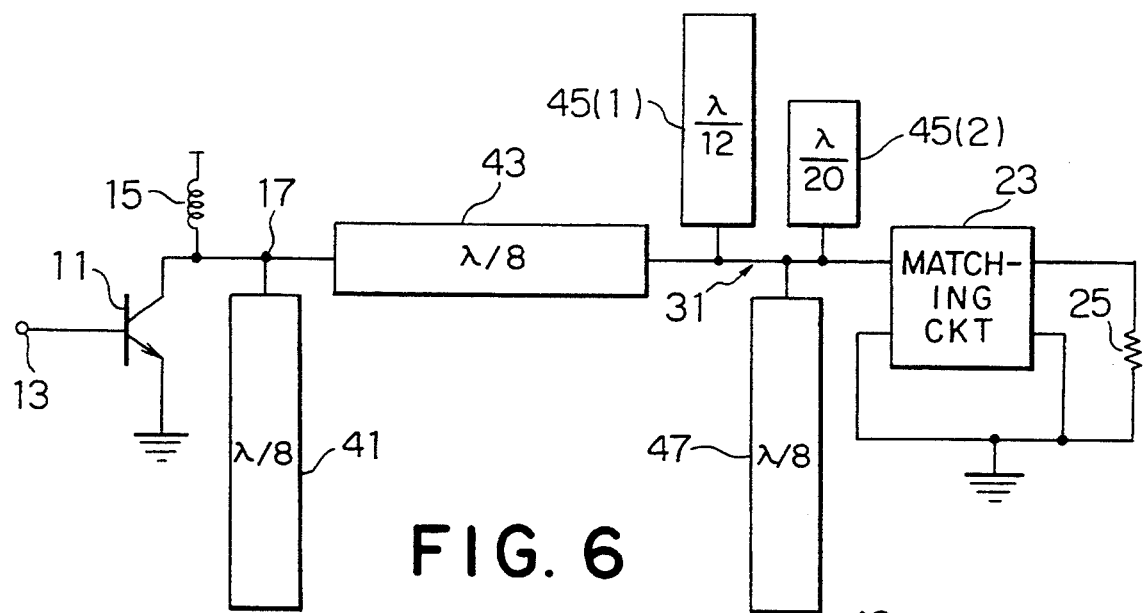
FIG. 6 similarly shows a structure of a power matching network according to a second embodiment of this invention.

Referring to FIG. 6, the description will be directed to a power matching network according to a second embodiment of this invention. The power matching network is again for use between the transistor amplifier and the load 25 which are described in conjunction with FIG. 4. Similar parts are designated by like reference numerals with the matching circuit 23 inclusive.

In the power matching network being illustrated, the line end 31 is connected additionally to an additional transmission line 47 having a length of a ⅛ wavelength of the fundamental frequency signal. The additional transmission line 47 has a free end grounded through a capacitor 49 for high frequency signals which are equal to or higher in frequency than the fundamental frequency signal. Inasmuch as the length of the additional transmission line 47 is equal to half, one, and n/2 wavelengths of $4n$-th harmonic signals, the line end 31 is shorted for the $4n$-th harmonic signals.

The length of the intermediate transmission line 43 is equal to half, one, and n/2 wavelengths of the $4n$-th harmonic signals. The output end 17 is therefore shorted in connection with these even harmonic signals. As a result, the power matching network is operable for the $4n$-th and the $(4n-2)$-th harmonic signals, namely, all even harmonic signals, and for the third, the fifth, the seventh, the ninth, and like odd harmonic signals, namely, $(2n+1)$-th harmonic signals, where n now represents integers starting at 1 and ending at a predetermined integer which is equal at least to 2.

Figure 7:
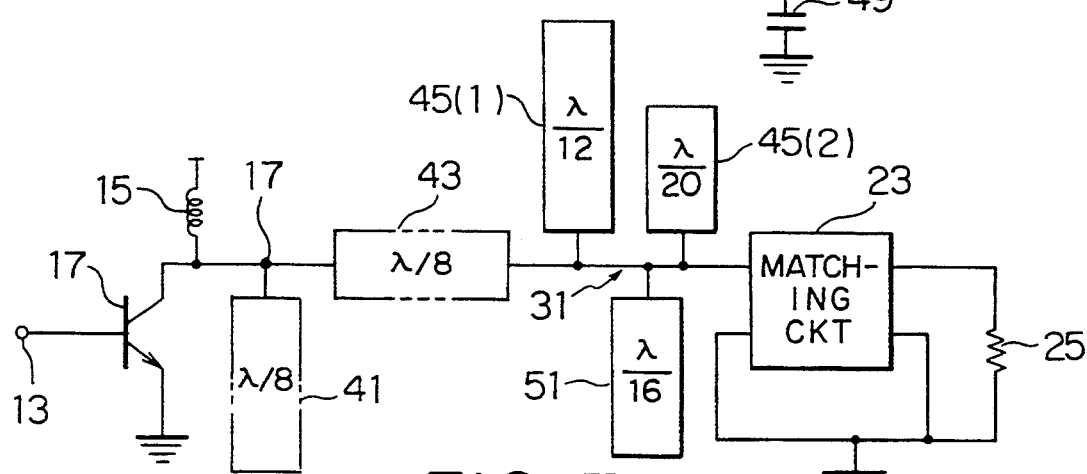
FIG. 7 likewise shows a structure of a modification of the power matching network depicted in FIG. 6.

Turning to FIG. 7, a modification of the power matching network of FIG. 6 comprises an additional transmission line 51 instead of a combination of the additional transmission line 47 and the capacitor 49 which are described in connection with FIG. 6. In FIG. 7, the additional transmission line 51 is an open-end transmission line having a length of a 1/16 wavelength of the fundamental frequency signal.

For the fourth harmonic signal, the additional transmission line 51 has a length of a quarter wavelength. The intermediate transmission line 43 has a length of a half wavelength. Consequently, the line end 31 is shorted with the output end 17 also shorted. The power matching circuit is operable for the fourth and the $(4n-2)$-th harmonic signals and for the third, the fifth, the seventh, and the like odd harmonic signals.

Figure 8:
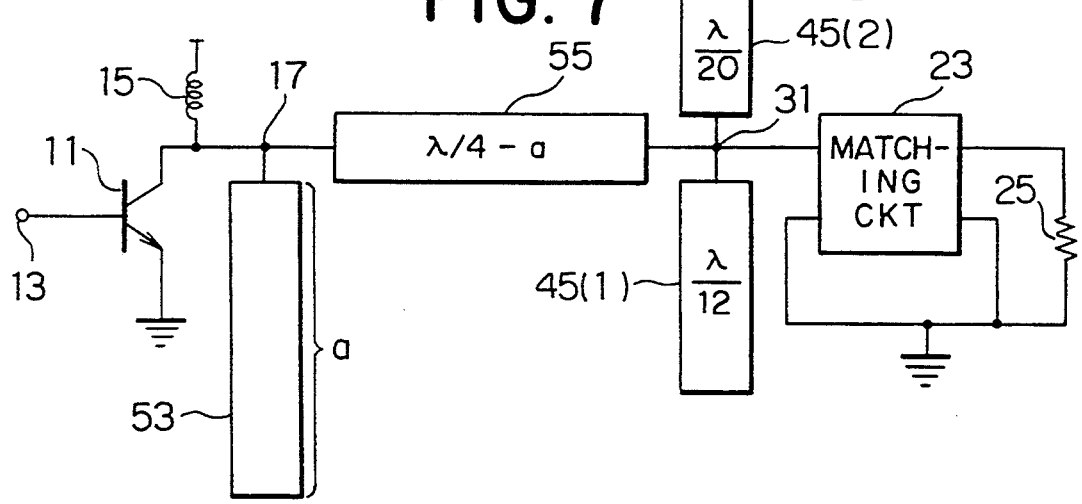
FIG. 8 likewise shows a structure of a power matching network according to a third embodiment of this invention.

Referring to FIG. 8, attention will be directed to a power matching network according to a third embodiment of this invention. The power matching network is for use once again between the transistor amplifier and the load 25. Including the matching circuit 23, similar parts are designated by like reference numerals.

In the power matching network under consideration, a basic open-end transmission line 53 is connected to the output end 17 and has a predetermined length a which is shorter than a quarter wavelength of the fundamental frequency signal. An intermediate transmission line 55 is connected between the output end 17 and the line end 31 and has a length which is equal to a quarter wavelength of the fundamental frequency signal less the predetermined length. The afore-mentioned at least one open-end transmission line 45 is connected to the line end 31 to short the line end 31 for at least the third and the fifth harmonic signals and to make the open-end transmission line 53 and the intermediate transmission line 55 collectively operable as a resonance circuit.

In operation, the open-end transmission line 53 has, when viewed from the output end 17, impedances as follows for the odd harmonic signals:

$$jZ_0 \cot((2n+1)a \times 2\pi/\lambda).$$

The intermediate transmission line 55 similarly has impedances given as follows:

$$jZ_0\tan((2n+1)(\lambda/4-a)\times 2\pi/\lambda)$$

or $jZ_0\cot((2n+1)a\times 2\pi/\lambda)$.

The output end 17 is therefore rendered open for at least the third and the fifth harmonic signals, namely, is given an infinitely great impedance for these odd harmonic signals.

It is now appreciated that the predetermined length is preferably nearly equal to a ⅛ wavelength of the fundamental frequency signal in order to provide a compact power matching network. At any rate, the power matching network is operable for the third, the fifth, and other odd harmonic signals.

Reviewing FIGS. 4 through 8, it is clear that the basic transmission line 41 may be given an open end correction with the length of the intermediate transmission line 43 accordingly adjusted. Preferably, the power matching network of FIG. 8 should additionally comprise either the combination of the additional transmission line 47 and the capacitor 49 or the additional transmission line 51. The power matching network in question may additionally comprise the transmission line 19 and the capacitor 21 as in FIG. 5. The transistor amplifier may be an amplifier circuit comprising at least one semiconductor device.

What is claimed is:

1. A power matching network for a transistor amplifier producing at its output end an amplified signal comprising a fundamental frequency signal and odd and even harmonic signals, said power matching network comprising:
    an open-end transmission line connected to said output end and having a length of a ⅛ wavelength of said fundamental frequency signal;
    an intermediate transmission line connected to said output end and having a line end and a length of said ⅛ wavelength;
    at least one open-end transmission line connected to said line end and having a quarter wavelength of said odd harmonic signal; and
    a matching circuit connected to said line end for said fundamental frequency signal.

2. A power matching network as claimed in claim 1, further comprising an additional transmission line connected to said output end and having a length of a quarter wavelength of said fundamental frequency signal and an end shorted for high frequency signals.

3. A power matching network as claimed in claim 1, further comprising an additional transmission line connected to said line end and having a length of said ⅛ wavelength and an end shorted for high frequency signals.

4. A power matching network as claimed in claim 1, further comprising an open-end transmission line connected to said line end and a length of a 1/16 wavelength of said fundamental frequency signal.

5. A power matching network as claimed in claim 1, wherein said at least one open-end transmission line consists of a plurality of open-end transmission lines having lengths of quarter wavelengths of $(2n+1)$-th harmonic signals, where n represents integers starting at 1 and ending at a predetermined integer which is equal at least to 2.

6. A power matching network for a transistor amplifier producing at its output end an amplified signal comprising a fundamental frequency signal and odd and even harmonic signals, said power matching network comprising:
    an open-end transmission line connected to said output end and having a predetermined length which is shorter than a quarter wavelength of said fundamental frequency signal and is not equal to a ⅛ wavelength of said fundamental frequency signal;
    an intermediate transmission line connected to said output end and having a line end and a length which is equal to said quarter wavelength less said predetermined length;
    at least one open-end transmission line connected to said line end and having a length of a quarter wavelength of said odd harmonic signal; and (claim 6 continued)
    a matching circuit connected to said line end for said fundamental frequency signal.

7. A power matching network as claimed in claim 6, wherein said at least one open-end transmission line consists of a plurality of open-end transmission lines having lengths of quarter wavelengths of $(2n+1)$-th harmonic signals, where n represents integer starting at 1 and ending at a predetermined integer which is equal at least to 2.

8. A power matching network as claimed in claim 7, further comprising an additional transmission line connected to said output end and having a length of a quarter wavelength of said fundamental frequency signal and an end shorted for higher frequency signals.

9. A power matching network as claimed in claim 7, further comprising an additional transmission line connected to said line end and having a length of a ⅛ wavelength of said fundamental frequency signal and an end shorted for high frequency signals.

10. A power matching network as claimed in claim 7, further comprising an open-end transmission line connected to said line end and having a length of a 1/16 wavelength of said fundamental frequency signal.

* * * * *